United States Patent [19]
Pence et al.

[11] Patent Number: 5,978,751
[45] Date of Patent: Nov. 2, 1999

[54] VARIEGATED MANUFACTURING PROCESS TEST METHOD AND APPARATUS

[75] Inventors: Donald Dean Pence; Jay Francis Raley, both of San Jose, Calif.

[73] Assignee: International Business Machines Corporation, Armonk, N.Y.

[21] Appl. No.: 08/804,991

[22] Filed: Feb. 25, 1997

[51] Int. Cl.$^6$ .................................................. G07C 3/14
[52] U.S. Cl. ...................... 702/179; 702/84; 364/468.17; 364/468.16; 364/468.24
[58] Field of Search ..................... 702/179, 180, 702/188, 81, 82, 83, 84; 324/73.1; 369/53, 58; 360/25, 31; 364/468.15, 468.17, 468.22, 468.24, 468.16, 478.01; 395/180, 183.01, 183.13, 183.15, 183.18, 184.01, 185.01

[56] References Cited

U.S. PATENT DOCUMENTS

| | | | |
|---|---|---|---|
| 4,837,764 | 6/1989 | Russello | 371/20 |
| 4,841,456 | 6/1989 | Hogan, Jr. et al. | 364/550 |
| 4,888,549 | 12/1989 | Wilson et al. | 324/73 R |
| 5,008,842 | 4/1991 | Nagai et al. | 364/551.01 |
| 5,086,397 | 2/1992 | Schuster et al. | 364/468 |
| 5,111,402 | 5/1992 | Brooks et al. | 364/424.04 |
| 5,148,363 | 9/1992 | Sakamoto et al. | 364/143 |
| 5,339,257 | 8/1994 | Layden et al. | 364/552 |
| 5,586,038 | 12/1996 | Nagaoka | 364/468.01 |
| 5,586,041 | 12/1996 | Mangrulkar | 364/474.16 |
| 5,598,341 | 1/1997 | Ling et al. | 364/468.17 |
| 5,644,705 | 7/1997 | Stanley | 395/183.18 |
| 5,737,519 | 4/1998 | Abdelnour et al. | 395/183.15 |
| 5,750,908 | 5/1998 | Drohan | 73/865.9 |
| 5,761,065 | 6/1998 | Kittler et al. | 364/468.24 |
| 5,774,875 | 6/1998 | Medeiros et al. | 705/28 |
| 5,787,021 | 7/1998 | Samaha | 364/552 |

OTHER PUBLICATIONS

Apte et al., "Predicting Defects in Disk Drive Manufacturing: A Case Study in High–Dimensional Classification", IEEE, 1993.

*Primary Examiner*—Patrick Assouad
*Attorney, Agent, or Firm*—Robert B. Martin

[57] ABSTRACT

A manufacturing test method and apparatus for testing devices, preferably magnetic disk drives, assembled or processed at ones of a plurality of stations in a variegated process stream from components originating from a plurality of sources of components, to determine failure statistics for selected ones of the plurality of stations or ones of the sources of components. The method comprises establishing a unit history record for each device, the unit history comprising entries for indicating the stations at which the device has been processed and the sources of components specific to the device; detecting the results of selected test/operation processes for devices in the stream; reading the unit history record for the device for which the results were detected to determine a "trace to" stations at which the device has been processed; logging the detected results, by updating a log for each of selected ones of the test/operation process and stations at which a device was processed as determined from the unit history record for the device, with the detected results for the device; calculating at least one "trace to failure" statistic for selected ones of the results and/or stations; updating the unit history record with the results for the device; and comparing the "failure" statistic to an alarm threshold and actuating an alarm if the threshold is exceeded.

19 Claims, 7 Drawing Sheets

VARIEGATED MANUFACTURING PROCESS TEST METHOD AND APPARATUS

TECHNICAL FIELD

This invention relates to test methods and apparatus for testing devices during manufacture, and more specifically, to the testing of devices which are assembled or processed at ones of pluralities of stations in a variegated process stream.

BACKGROUND OF THE INVENTION

The testing of manufactured devices at the end of the manufacturing process or of subassemblies at subassembly and subprocess points in the manufacturing process are well known. An example of a test module for a plurality of magnetic disk drives is shown in U.S. Pat. No. 4,888,549, assigned to Wilson Laboratories, Inc. The use of automated testers or computers to conduct the testing and to accumulate the test results is also known. An example of an automated tester computer is illustrated in U.S. Pat. No. 4,841,456.

Such testers typically test each device and pass or fail the device for the specific test. If the test failure is repairable, the device is reworked, reinserted in the manufacturing line, and retested. The test data is often accumulated and may be reviewed in batch mode. The typical assembly line is singular and the test data accumulated in a tester may be utilized to analyze the specific associated assembly line.

Magnetic disk files, however, are currently assembled from components, where not only do different components arrive from different sources, but the same components, such as disks, are provided from different sources. Further, some of the assembly may be done in an assembly line fashion, but most often, the assembly is done in subassemblies at ones of many parallel stations, the output of the parallel stations stored together or intermixed between sequential stations, and the intermixed subassemblies separated into non-segregated groups for further assembly or testing. Hereinafter, the intermixing and subsequent separation into non-segregated groups is called a "variegated" process stream. The reason for the variegated process is because the steps require substantially different lengths of time to accomplish. Thus, more stations are required to accomplish the longer process steps. Only with a variegated process stream, can the overall manufacturing process flow smoothly. Thus, there is no direct correlation between the tester and the source of the components or the preceding assembly stations for the devices being tested.

At some point, the accumulated testing data may be utilized in batch mode to analyze the assembly process. A key problem is the need to ascertain a common tester, tool, station, source of components or process that produced the failing devices.

A typically expensive subsequent analysis of accumulated testing data by failure analysis personnel might lead eventually to an understanding of a root cause source of a problem. What is needed is a means and process for identifying the source of the problem during the manufacturing process on a real time basis, so that the problem may be addressed and corrected before productivity or production will be lost, or excess scrap or rework is created.

SUMMARY OF THE INVENTION

Disclosed are manufacturing test method and apparatus for testing devices, preferably magnetic disk drives, assembled or processed at ones of a plurality of stations in a variegated process stream from components originating from a plurality of sources of components, to determine failure statistics for selected ones of the plurality of stations or ones of the sources of components. The method comprises establishing a unit history record for each device, the unit history comprising entries for indicating the stations at which the device has been processed and the sources of components specific to the device; detecting the results of selected test/operation processes for devices in the stream; reading the unit history record for the device for which the results were detected to determine a "trace to" stations at which the device has been processed; logging the detected results, by updating a log for each of selected ones of the test/operation process and stations at which a device was processed as determined from the unit history record for the device, with the detected results for the device; calculating at least one "trace to failure" statistic for selected ones of the results and/or stations; updating the unit history record with the results for the device; and comparing the "failure" statistic to an alarm threshold and actuating an alarm if the threshold is exceeded. Aged logged results are deleted by making negative entries of the aged logged results so they are thereby cancelled.

The present invention continuously monitors the manufacturing process and is likely to discover the root cause of the problem as soon as possible, thereby saving scrap and rework costs, improving yields, and mean centering the process.

For a fuller understanding of the present invention, reference should be made to the following detailed description taken in conjunction with the accompanying drawings.

DETAILED DESCRIPTION OF THE INVENTION

Figure 1:
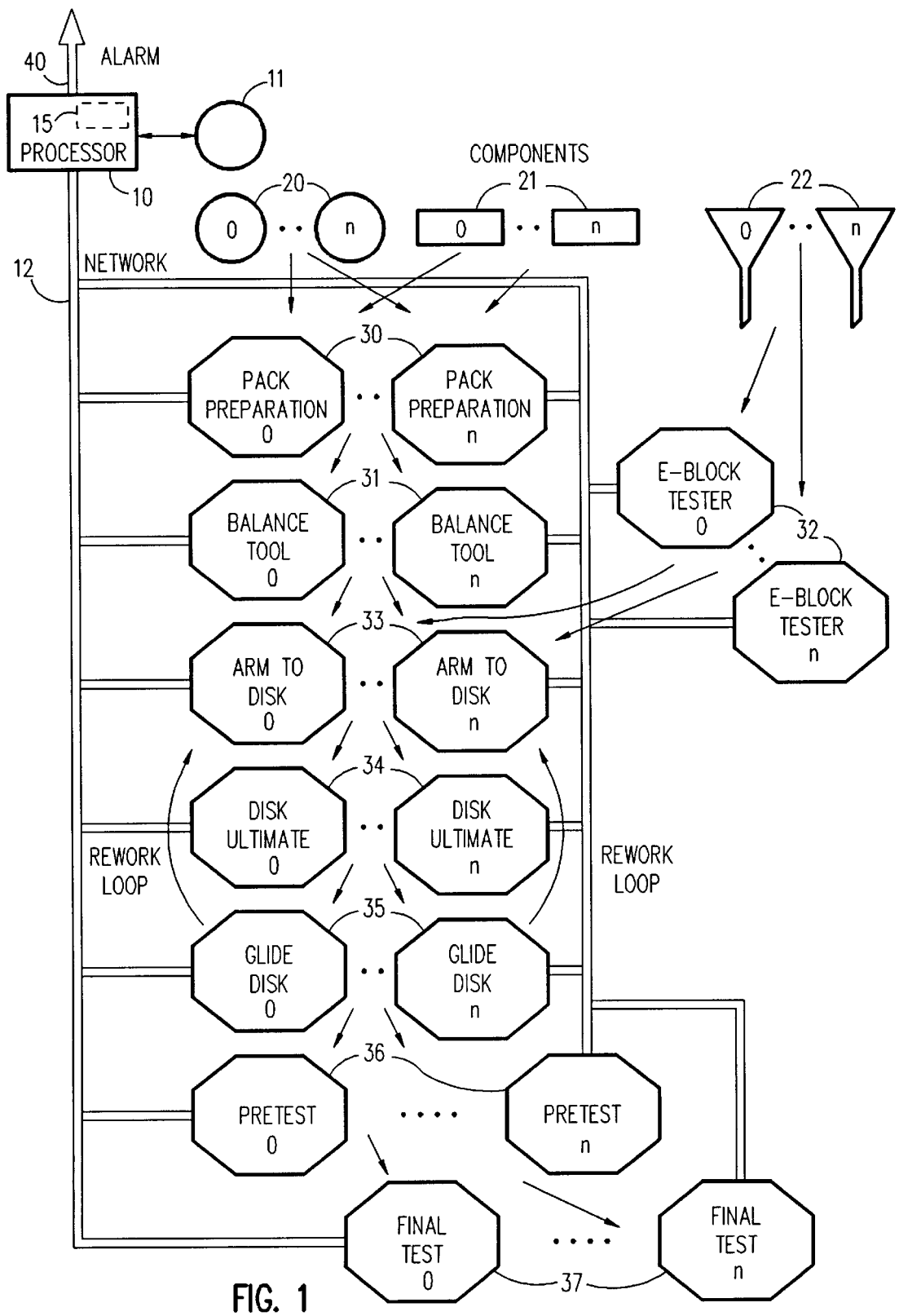
FIG. 1 is a block diagrammatic representation of a variegated manufacturing process stream and of a testing system of the present invention.

Referring to FIG. 1, the testing system of the present invention comprises a computer processor 10 and disk drive 11, which may be a networking PC or workstation, and a network 12 which is connected to many of the stations of the manufacturing process system. The manufacturing environment suited to the present invention comprises the assembly of a very large number of devices, preferably magnetic disk files, which are assembled or processed at ones of pluralities of stations in a variegated process stream from components originating from a plurality of sources of components.

The manufacturing processes comprise a number of similar tools in parallel, each conducting the same operation, and passing the processed device to the next type of station, but not comprising parallel sets of assembly lines. Rather, the output of one of a set of tools may be passed to any of the next set of tools. Some, or none, of the tools and testers may be arranged in parallel sets of assembly lines for a portion of the manufacturing process, but there is no complete set of parallel assembly lines.

The process is illustrated in FIG. 1 with respect to magnetic disk files, wherein disks and spindles 20 from a plurality of sources or suppliers of disks and spindles 0 through n are received together with motors and bases 21 from a plurality of sources or suppliers of motors and bases 0 through n. The number of such sources of components may be any number, but most manufacturing companies prefer at least two suppliers of each component, and each supplier may have its own multiple "sources", i.e., multiple manufacturing lines and, perhaps, multiple manufacturing facilities. Another component shown is heads and actuators 22. The particular set of component subassemblies shown is for the purpose of illustration and is not intended to limit application of the present invention to the particular set of components nor to limit application of the present invention to magnetic disk files.

Each of the octagonal blocks 30–37 illustrated in FIG. 1 is a station in the variegated manufacturing process, and each is connected to the network 12. Other stations or storage points may be provided between sequential ones of the illustrated stations, but are not shown as they are not connected to network 12. No station performing the function of one of the stations connected to network 12 is left unconnected to the network, however. This provides assurance that the data collected by the processor 10 is complete.

The sets of stations are all shown as having 0 through n stations in each set. The number of stations in each set is different because the process conducted in each set requires a substantial difference in time to accomplish. Thus, in order to have a smooth overall manufacturing process flow, the longer steps require more stations.

The exemplary first set of stations 30 are pack preparation stations 0 through n, where the disks and spindles 20 are assembled with the motors and bases 21 into a pack. There may, for example, be 10 stations 30 throughout the facility, each connected to network 12.

Each station transmits a standard set of information back to the processor 10 in real-time when it has completed its processing. According to the preferred embodiments, each record sent to the processor over the network 12 contains the following:

an identifier of the step process operation (i.e. "PP")

a serial number or other identifier of the device (i.e. "13012345P9")

a time-stamp of when the station completed the step traced aspects (members): e.g., station id, employee id, experiment id, etc.

sub-component identifiers (if applicable)

completion code (pass or fail)

all unique failing error codes (if any).

The processor 10 maintains in its fast memory 15, a model of the manufacturing process for the product type being manufactured, identified by a product id. The unifying field of the model is the device serial number, which allows a build history for each disk drive to be generated. Preferably, for each unique serial number, the processor keeps in its memory 15 one set of common information and a fixed number of sets of the repeating data equal to the total number of sequential stations in the manufacturing process that are connected to the network 12, as follows:

Common Information in the Unit (Device) History device serial number sub-component serial numbers product id—the type of product or device model Repeating Fields (one for each station or operation) in the Unit Device History operation—operation id operation—tool or tester station id operation—software version operation—time stamp operation—shift id operation—operator id operation—experiment id operation—retry count.

The specific information to be provided in each field may be altered without departing from the scope of the invention, however, such information and fields provided should be consistent across all devices and all operations.

The remaining examples of further types of test station operations illustrated in FIG. 1 will now be explained.

Stations 31 comprise balance tools (process identifier "BT") which spin the disks, measure any imbalance, and adjust the balance of the pack. It is unlikely that any disk pack cannot be balanced, but a "fail" at the station may be possible. Balancing is faster than pack preparation, and it is likely that only 4 or 5 balance stations would be provided.

Stations 32 comprise E-block testers for assembling the heads and arms into an E-block and then assembling the E-block with the actuator and testing the assembled heads and actuator. As modern magnetic disk drives employ magneto-resistive (MR) heads, the process identifier is "MR". Many such stations are provided.

The balanced disk packs and the assembled E-blocks are both provided to arm-to-disk (process identifier "AD") stations 33. This type of station measures the disk-to-disk spacings and the E-block arm-to-arm spacings to match the spacings, and the disk packs and E-blocks are assembled.

Stations 34 are called the "disk ultimate" testers (process identifier "DU") and comprise a test of the disk file with the enclosure cover on. The disk file is spun up and tested for operability and head-to-disk fly height. All sub-component bar codes are read, such as those identifying the file, actuator and motor. In the illustrated example, the "DU" testers are the point at which all the information is consolidated.

The glide disk stations 35 (process code "GD") write the servo signals on the disks. These testers measure the disk dings or asperities, where the problems are detected, using the read head output of the drive. Failure at the glide disk station may result in conducting rework on the drive to perfect it, and sending the drive back to an arm to disk station 33.

Pretest stations 36 (process code "PT") provide the first functional test of the disk drives. A drive card is installed on the file and circuitry on the card is used to test some of the functions of the drive.

Lastly, the final test (process code "FT") 37 is conducted. This is a very extensive test and many such stations are required. The actuator, read and write, and seek times are tested and compared to tolerances.

Failure at any of the stations results in the provision of an error code to the microprocessor 10 by the station together with the other data discussed above.

One of the goals of the present invention is to generate an alarm on line 40 when one of the test steps fails a device, and there is a coincidence of statistical significance of the particular error code to previous events. Specifically, the statistical significance comprises the identification of too many devices failing in the same way for what appears to be a common cause identified in the unit build history of the failing drive.

The calculation for statistical significance uses a conventional formula which calculates "Sigma" which relates the probability of the event to a random occurrence. The higher the Sigma, the more unlikely the event was caused by random chance, 0 being the most random.

The intention is to compare the fallout rates, or error count versus tested count, of a particular population, herein called "member" population, to the fallout rates of a whole population, herein called "group". When the member population's fallout is significantly different from the group's fallout, the alarm is generated. A "member" is each of a specific combination of sources of components, stations, operators etc., that the specfic device has gone through to the point of the current test. Thus, each "PASS" will update a tested count of each "member" population in the "group" of members, and a "FAIL" will update both the tested count and the failed count, and will update a count of the particular failure reason.

A key facet of the invention is to keep a running average of the various fallout rates of all of the possible error codes generated. The dynamic nature of the running average allows the invention to self-adjust to changing situations, thereby simplifying the operation of the invention and reducing the update cost of the system. Specifically, the running average is designed to be dynamic in that, with each device tested, the fallout rate is assured to change slightly. Simply accumulating all of the device test results would ultimately produce a large data base that loses this dynamic characteristic. Thus, the present invention deletes the influence of the devices whose data is aged after a period of time to keep the sample size relatively small and up to date, thereby providing the true dynamic capability.

The deletion is accomplished by utilizing the time-stamp for the operation and adding a negative of the device pass or fail test results and the failure code, if any, to the statistics.

Figure 2:
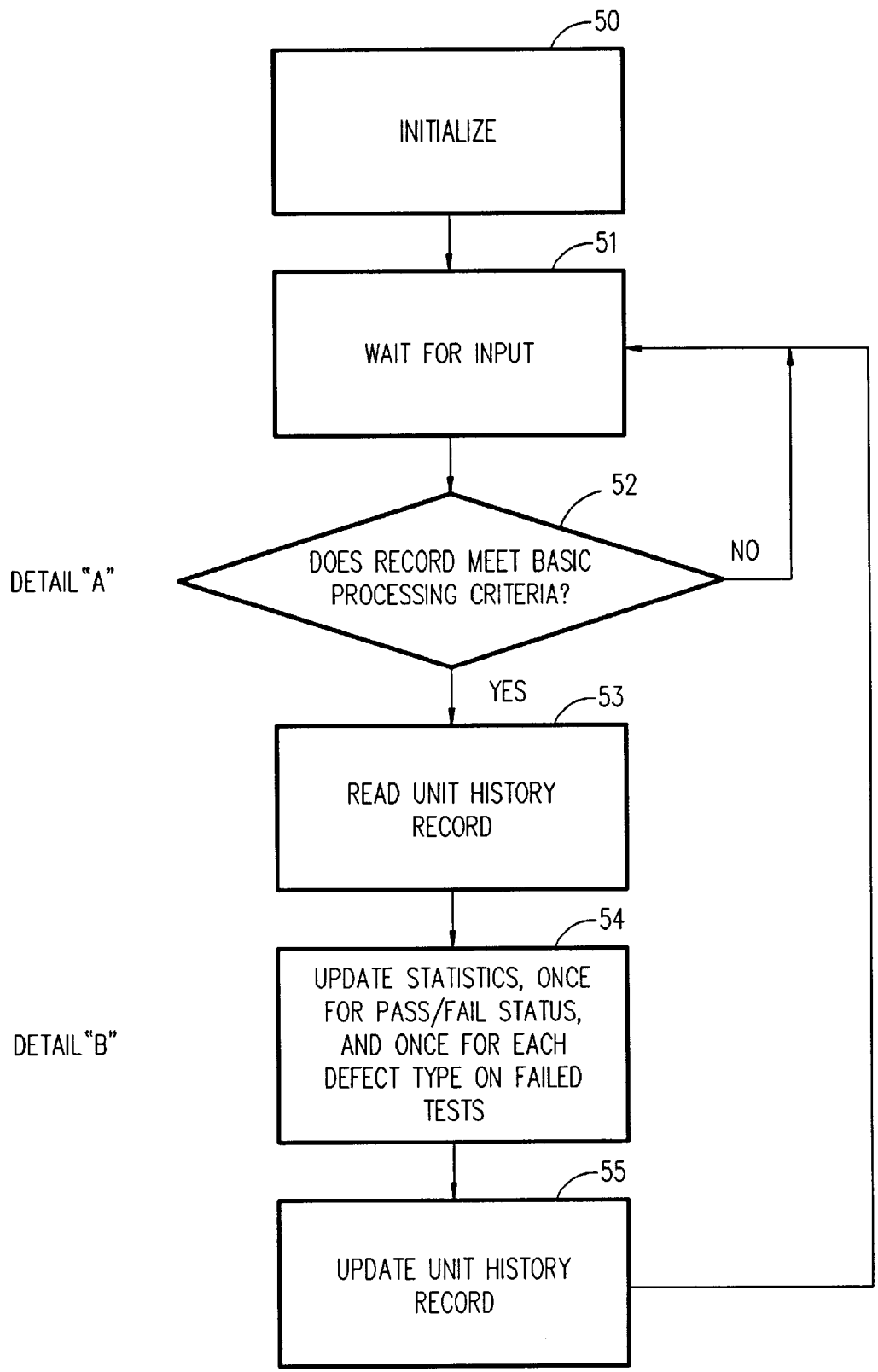
FIG. 2 is a flow chart depicting the testing method of the present invention.

An exemplary method of the present invention is illustrated in FIGS. 2–7. FIG. 2 comprises the high level view of the method of responding to any single input from any single station of FIG. 1 provided on network 12 to processor 10.

After initialization in step 50 in FIG. 2, the system waits for an input, i.e., a record associated with a particular disk drive at a particular test unit, in step 51. Upon receipt of an input, a determination is made of whether or not the input record is valid in step 52, which is defined in Detail "A", hereinafter. If not valid, the method loops back to step 51. If the record input is valid, the history record of that disk drive is read in step 53 to determine the "members" relating to the drive at previous steps or the source of the components therefor as described above.

As a further description of the unit history record mentioned above, a single record is stored in a database on disk 11 of FIG. 1 for each disk drive or device. There is keyed access to this record, based on the unique device serial number. It contains all of the information provided from each preceding station of the manufacturing process for that disk drive and any sub-component information provided previously.

As described above, the information stored in the history record for each one of the previous tester operations at the previous stations for the device includes such items as the operation id, tool or station id, time stamp, shift and operator id.

As will be described hereinafter with respect to Detail "B", the information from the unit history record is utilized in step 54 to particularize the population of devices to specific "members" which have undergone the same tester operation at the same station, etc., as traced to the information in the histories of the devices. New information, such as "tested" and "fail defect type" (only if the device failed) is then logged to update the database for the particular member populations, and a statistical analysis is conducted to determine whether a significant fallout has occurred in each member population relative to a group population.

Upon completion of the statistical update, the unit history record for the device is updated in step 55. The method then loops back to the "wait" status of step 51.

Figure 3:
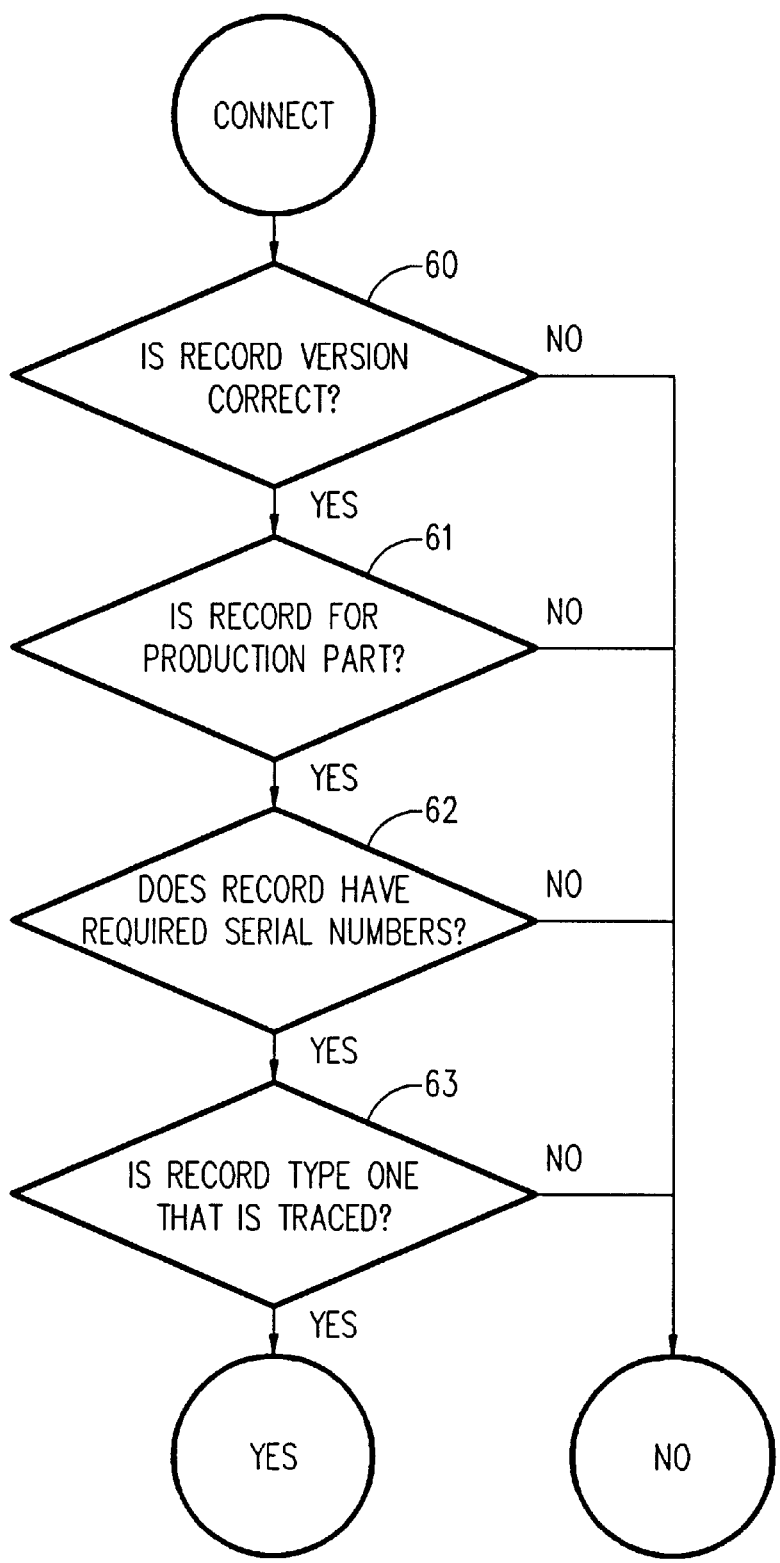
FIG. 3 is a flow chart depicting "Detail A" of FIG. 2.

FIG. 3 comprises Detail "A" of step 52 in FIG. 2. The first decision to be made in block 60 is whether the input record is at the correct software level or version. If so, decision block 61 determines whether the record is for a production part. (This step assumes that the test tool may be used for other purposes, such as special purpose parts). If it is a record relating to a production part, the decision made in block 62 is whether the required serial numbers have been captured, and, lastly, in block 63, whether the record type is one that is traceable back to the previous steps. A "No" decision at any point results in the record being ignored for the purpose of the present method, and the method loops back to step 51 in FIG. 2 to wait for another input from the same or another station.

Figure 4:
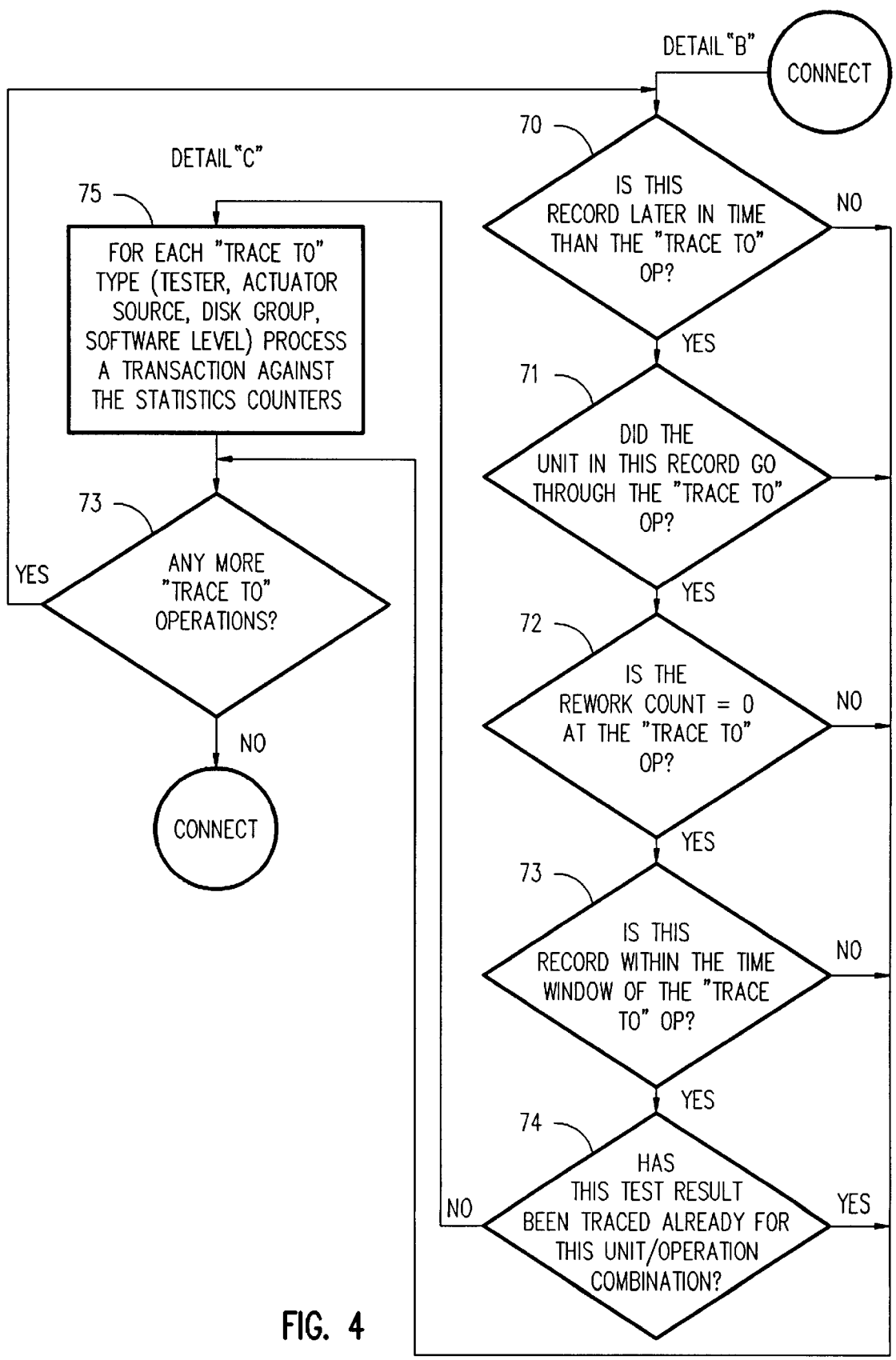
FIG. 4 is a flow chart depicting "Detail B" of FIG. 2.

FIG. 4 comprises Detail "B" of step 54 in FIG. 2, which updates the appropriate statistics for the correct traceable or "Trace to" member subgroup, so that the appropriate member statistics for each member can be analyzed for statistically significant fallout levels(error rates). Several "Trace to" members exist for each input record as described above. Thus, the sequence of FIG. 4 is cycled for each such member and, if "FAIL", for the failure codes therefor, until all "Trace to" member subgroup statistics have been updated.

Decision block 70 uses the time stamp for the input record to insure that the step of the input record occurred after the previous operation that is being traced to. If "No", the device is totally out of sequence or from another day and must be ignored. If "Yes", decision block 71 detects whether there is a record of the previous operation. The members must be consistent, so block 72 makes sure that there has been no rework such that only the first pass is counted. If there has been rework and the input record is for a second pass, it is ignored from the statistical standpoint for the current operation. The information will be added to the record for the specific device, however.

It is best to only trace back to recent tester operations, since past results may skew the statistics incorrectly. Thus, decision block 73 refers to a configuration table for each input operation to determine the appropriate time window and determines whether the input record operation is within the window. Block 74 then checks to make sure there is no double counting of the same test of the same device.

For each "Trace to" member, block 75 processes a transaction against the statistics therefor as described with respect to Detail "C", hereinafter. Block 76 determines whether the "Trace to" operations have been completed and the member subgroup statistics updated for the current input record.

Figure 5:
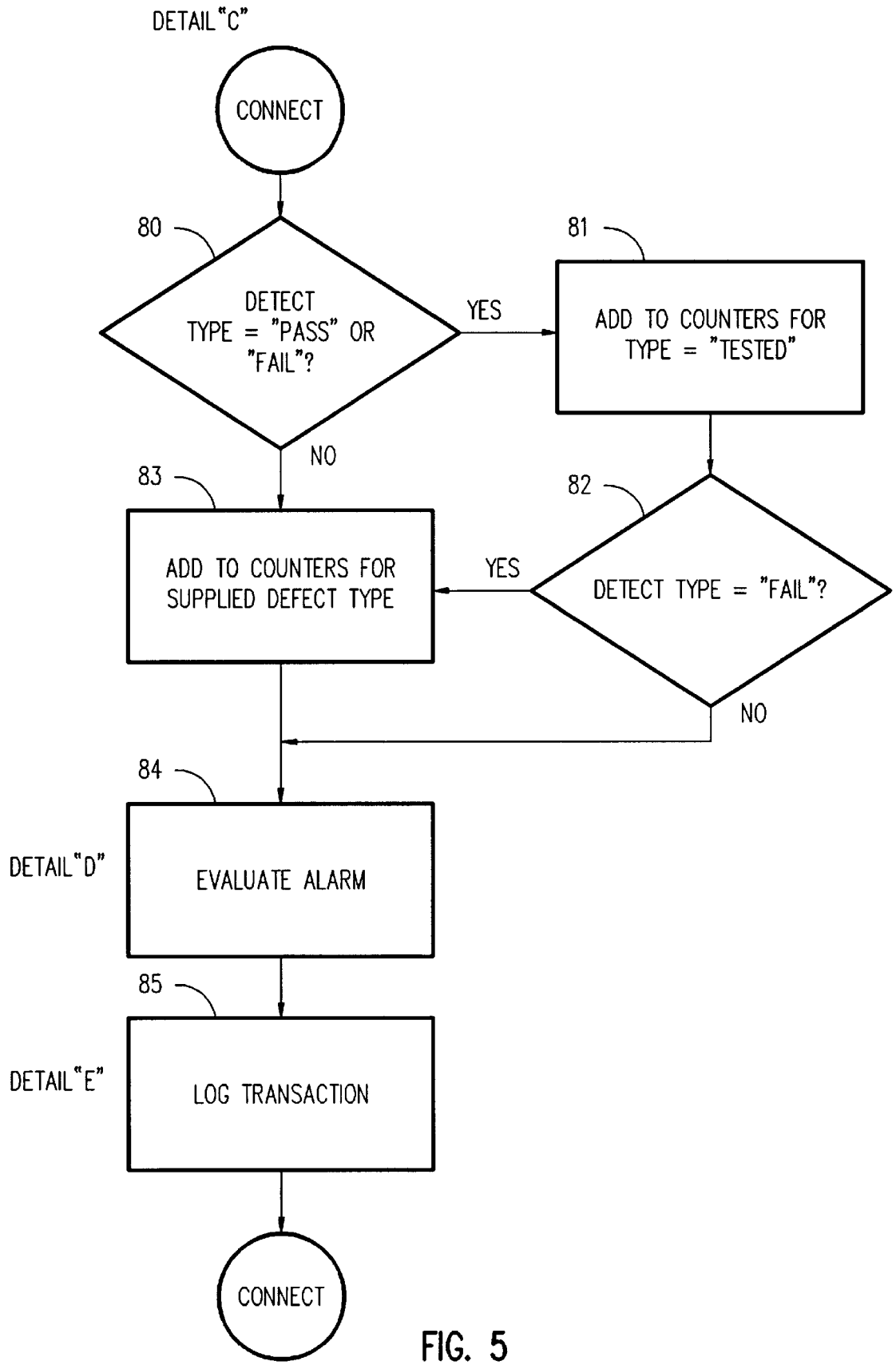
FIG. 5 is a flow chart depicting "Detail C" of FIG. 4.

FIG. 5 comprises Detail "C" of step 75 of FIG. 4 to log the test information. The routine of FIG. 5 is utilized to separately log the "Tested" counters, the "FAIL" counters, and the counters for specific defect type failure codes. For the purpose of FIG. 5, "PASS" or "FAIL" are treated as special and not as specific defect type failure codes. Decision block 80 determines whether the current record is providing the initial "PASS" or "FAIL" status. If so, block 81 adds the information to counters for the specific members as "Tested". Whether the test resulted in pass or fail is checked in block 82. If the device failed, the "Failed/Defect" counters for the specific members are incremented in step 83. If the current record is identifying a defect type failure code, decision block 80 determines that the defect type is not the special "PASS" or "FAIL" status, and step 83 increments the "defect" counters for the specific failure codes for the specific members. Step 84 evaluates the new logged counts to determine whether a statistically significant fallout has occurred, as will be described with respect to Detail "D", hereinafter. Step 85 then logs the transaction, as will be described with respect to Detail "E", hereinafter.

The counters of steps 81 and 83 are, in the preferred mode, maintained in memory 15 of processor 10 of FIG. 1 as ordered link lists for high performance. In operation, the method of the present invention may process over 100,000 records in a 24 hour period and have 20 member transactions per record. Thus, for maintaining a high level of real-time performance, it is preferred that there be no I/O to disk 11 to update each counter.

Figure 6:
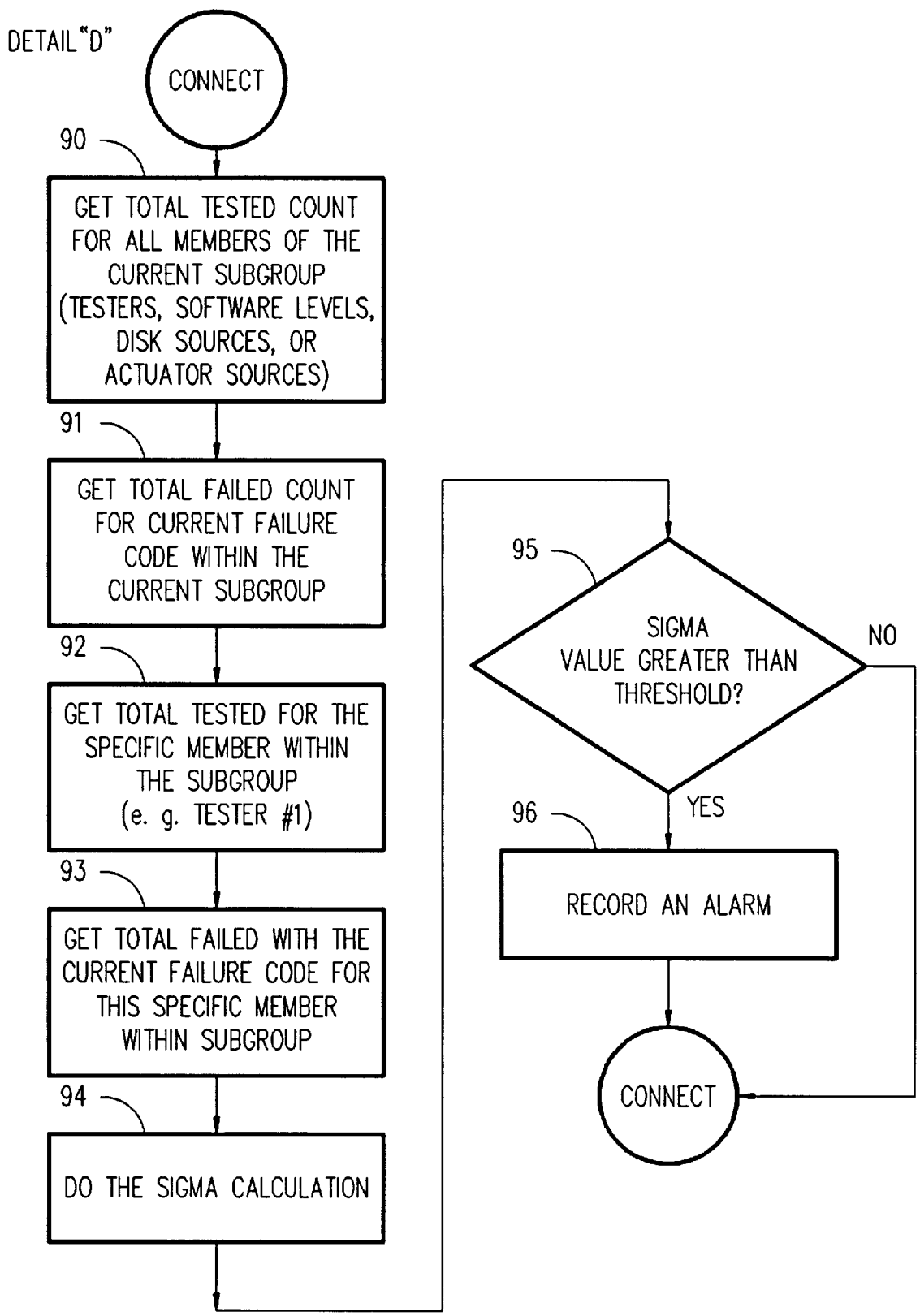
FIG. 6 is a flow chart depicting "Detail D" of FIG. 5.

FIG. 6 comprises Detail "D" of step 84 in FIG. 5. Step 90 accesses the total tested count for all members of the current subgroup. Subgroups may comprise all of certain members, such as types of testers, or other related members that are deemed to be important. The listed subgroups are only a few of the examples of possible subgroups. Step 91 accesses the total failed count for the current failure code within the subgroup, step 92 accesses the total number of devices tested for the specific member within the subgroup, and step 93 accesses the total number of devices failed with the current failure code for this specific member within the subgroup. The Sigma calculation for the specific member and the subgroup are conducted conventionally in step 94. Step 95 compares the Sigma calculation to statistically significant thresholds. The thresholds are previously determined as being significant by the user. If greater than a threshold, step 96 comprises sending an Alarm on line 40 in FIG. 1.

Figure 7:
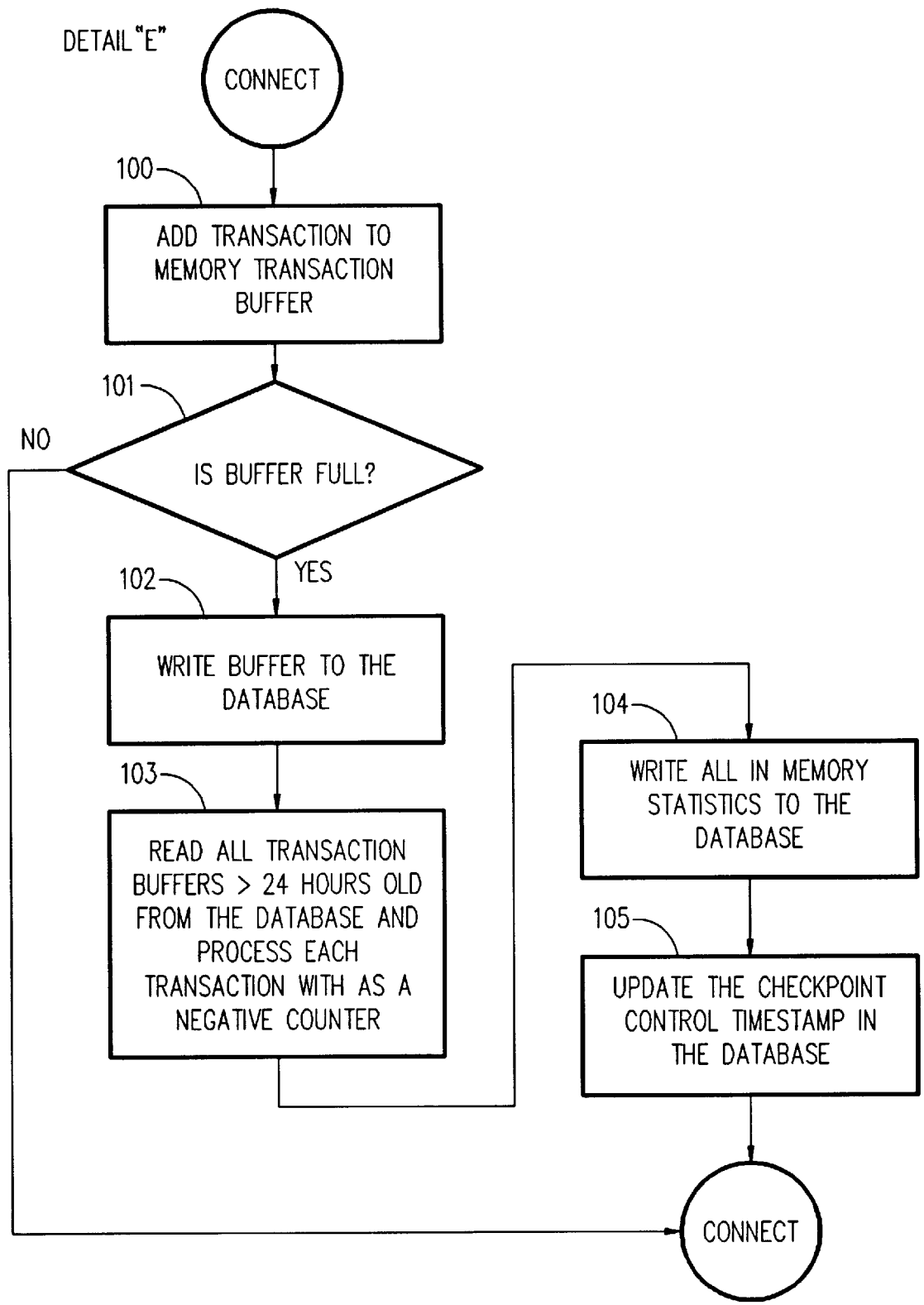
FIG. 7 is a flow chart depicting "Detail E" of FIG. 5.

FIG. 7 comprises Detail "E" of step 85 of FIG. 5. Step 100 adds the current transaction information to a transaction buffer in memory 15 of processor 10 in FIG. 1. The transaction information comprises the operation id (such as "PP"), the tool or station id, etc., and the pass/fail results, as described above. Step 101 checks whether the buffer is full. If so, step 102 writes the buffer to the disk 11 in FIG. 1. In order to maintain the dynamic information logged in counters for the statistical analysis of Detail "D", step 103 reads all transaction buffers from the database that are aged by a predetermined age factor, such as 24 hours. Each aged transaction is removed from the database, preferably by processing it as a negative added to the count, thereby cancelling the aged information from the counters.

Existing statistics are written to the database in step 104, and a Checkpoint control time stamp is updated in step 105.

The unit history record is then updated in step 55 of FIG. 2 and the process loops back to wait for the next input from a station at step 51.

The methodology described herein may be implemented in any suitable processor, as is well known to those of ordinary skill in the art. The specific flow charts may also be modified as best suited to the specific arrangement of the manufacturing facility and products or devices manufactured or processed thereat.

While the preferred embodiments of the present invention have been illustrated in detail, it should be apparent that modifications and adaptations to those embodiments may occur to one skilled in the art without departing from the scope of the present invention as set forth in the following claims.

We claim:

1. Method for testing devices during processing at ones of a plurality of stations in a variegated process stream, comprising a plurality of sets of said stations, each said set of said stations comprising a plurality of said stations having the same function, wherein each said device is assembled at one of said plurality of stations in each said set of stations, said method comprising the steps of:

detecting results of selected test/operation processes for devices in said stream;

logging said detected results for subsequent "trace to" calculation, comprising updating a log for each said selected test/operation process and associated said station at which a device was processed with said detected results for said device;

calculating at least one "trace to failure" statistic for selected ones of said detected results of said log entries with respect to said associated stations; and comparing said "trace to failure" statistic for said associated stations to an alarm threshold and actuating an alarm if said threshold is exceeded.

2. The method of claim 1, wherein:

said "trace to failure" statistics comprise "pass/fail" statistics of a specific set of historical test/operation processes for said associated stations.

3. The method of claim 2, wherein:

said step of calculation of said "trace to failure" statistics comprises calculation of said statistics with respect to selected ones of said detected results of said log entries with respect to said associated stations.

4. The method of claim 2, wherein:

said detected results comprise test failure results with specific "failure" codes; and said step of calculation of "trace to failure" statistics comprises calculation of "failure" statistics for specific "failure" codes.

5. Method for testing devices processed at ones of a plurality of stations in a variegated process stream, comprising a plurality of sets of said stations, each said set of said stations comprising a plurality of said stations having the same function, wherein each said device is assembled at one of said plurality of stations in each said set of stations from components originating from a plurality of sources of components, said method comprising the steps of:

establishing a unit history record for each said device, said record comprising entries for indicating said stations at which said device has been processed and said sources of components specific to said device;

detecting results of selected test/operation processes for devices in said stream;

reading said unit history record for each said device for which said results were detected to determine a "trace to" associated said stations at which said device has been processed;

logging said detected results, comprising updating a log for each of selected ones of said test/operation processes and said associated stations at which a device was processed as determined from said read unit history record for said device, with said detected results for said device;

calculating at least one "trace to failure" statistic for selected ones of said detected results of said log entries with respect to said associated stations; and updating said unit history record with said results for said device.

6. The method of claim 5, comprising the additional step of:

comparing said "trace to failure" statistic to an alarm threshold and actuating an alarm if said threshold is exceeded.

7. The method of claim 6, wherein:

said "trace to failure" statistics comprise "pass/fail" statistics of a specific set of historical test/operation processes for at least one of said stations determined from reading said unit history record.

8. The method of claim 7, wherein:

said logs updated in said logging step comprise counters for each subgroup, each subgroup comprising a selected test/operation process or station, said counters comprising counts of devices processed and counts of said detected results for said subgroup; and said step of calculation of said "trace to failure" statistics comprises calculation of said statistics from selected ones of said log counters with respect to selected ones of said subgroups.

9. The method of claim 8, wherein:

said counters comprise ordered link lists maintained in memory.

10. The method of claim 8, wherein:

said detected results comprise test and failure results with specific "failure" codes; and said calculation of "trace to failure" statistics comprises calculation of "failure" statistics for specific "failure" codes.

11. Apparatus for testing devices processed at ones of a plurality of stations in a variegated process stream, comprising a plurality of sets of said stations, each said set of said stations comprising a plurality of said stations having the same function, wherein each said device is assembled at one of said plurality of stations in each said set of stations, said apparatus comprising:

an input at selected ones of said stations for providing an indication of said station and of said device processed at said station;

a database of records for storing said indications of said stations and said devices, thereby establishing a trace of sequence of processes for each said device indicating associated said stations at which said device has been processed;

at least one testing station for testing said devices and providing the results of selected tests for each tested device in said stream;

a plurality of logs for accumulating said testing results, each said log representing one of said stations; whereby said logs add said results for each said device to the logs for said associated stations of said trace for said tested device indicated by said database; and a calculator responsive to said database and said logged testing results for calculating at least one "failure" statistic for selected ones of said provided results related to said stored trace of said sequence of processes of each said tested device for said associated stations, whereby said "failure" statistic relates to said associated processes/stations.

12. The testing apparatus of claim 11, wherein:

said calculator additionally compares said "failure" statistic for said associated processes/stations to an alarm threshold and actuates an alarm if said threshold is exceeded.

13. Apparatus for testing devices processed at ones of a plurality of stations in a variegated process stream, comprising a plurality of sets of said stations, each said set of said stations comprising a plurality of said stations having the same function, wherein each said device is assembled at one of said plurality of stations in each said set of stations from components originating from a plurality of sources of components, said apparatus comprising:

an input at selected ones of said stations for providing an indication of said station and of said device processed at said station;

a database of records for storing said indications of said devices, components and stations, said database of records comprising a single record representing each said device, said single record comprising at least a device id representing said device and said components thereof, a station id and an operation id for each station and selected process conducted on said device to this point, thereby establishing said trace of sequence of processes for each said device at indicated associated said stations at which said device has been processed;

at least one testing station for testing said devices and providing the results of selected tests for each tested device in said stream; and a calculator responsive to said database device id, station ids, and operation ids for said tested device and said associated stations, and said testing station for calculating at least one "failure" statistic for selected ones of said provided results related to said stored trace of sequence of processes at said associated stations or of said components of each said tested device, whereby said "failure" statistic relates to one of said sequence of processes and said associated stations or to one of said sources of components.

14. The testing apparatus of claim 13, wherein:

said calculator additionally compares said "failure" statistic to an alarm threshold and actuates an alarm if said threshold is exceeded.

15. The testing apparatus of claim 14, additionally comprising:

a plurality of logs for accumulating said testing results, each said log representing one of said processes and one of said stations; whereby said logs add said results for each said device to the logs for the process and stations of said trace for said tested device indicated by said database; and said calculator is responsive to said logged testing results for calculating said "failure" statistic for a common set of said processes or of said stations.

16. The testing apparatus of claim 15, wherein:

said logs comprise a plurality of counters for accumulating the number of devices tested and for accumulating the number of devices failed for said one of said processes and one of said stations.

17. The testing apparatus of claim 16, additionally comprising:

an update processor for maintaining the currency of said logs by deleting aged ones of said testing results therefrom.

18. The testing apparatus of claim 17, wherein:

said update processor adds negative entries of said aged logged results to said logs to thereby cancel said aged logged results therefrom.

19. The testing apparatus of claim 17, wherein:

said update processor additionally selects testing results older than a predetermined time window for deletion.

* * * * *